(12) United States Patent
Krishnamurthi

(10) Patent No.: US 10,601,372 B1
(45) Date of Patent: Mar. 24, 2020

(54) POWER EFFICIENT RADIO FREQUENCY (RF) MULTIPLIERS

(71) Applicant: BAE SYSTEMS INFORMATION AND ELECTRONIC SYSTEMS INTEGRATION INC., Nashua, NH (US)

(72) Inventor: Kathiravan Krishnamurthi, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/213,781

(22) Filed: Dec. 7, 2018

(51) Int. Cl.
*H03D 7/14* (2006.01)
*H04B 1/16* (2006.01)
*H03D 7/16* (2006.01)

(52) U.S. Cl.
CPC ........... *H03D 7/1458* (2013.01); *H03D 7/145* (2013.01); *H03D 7/165* (2013.01); *H04B 1/16* (2013.01); *H03D 2200/009* (2013.01)

(58) Field of Classification Search
None
See application file for complete search history.

(56) References Cited

U.S. PATENT DOCUMENTS

| | | | | |
|---|---|---|---|---|
| 6,529,721 B1 * | 3/2003 | Tiller | ............... | H03D 7/1425 455/323 |
| 2003/0148751 A1 * | 8/2003 | Yan | ............... | H03D 7/145 455/318 |
| 2009/0221259 A1 * | 9/2009 | Shiramizu | ............ | H03D 7/1433 455/334 |
| 2014/0139274 A1 | 5/2014 | Lee et al. | | |
| 2014/0312955 A1 * | 10/2014 | Stroet | ............... | H03D 7/1433 327/359 |
| 2018/0159516 A1 | 6/2018 | Ye et al. | | |

OTHER PUBLICATIONS

Harrison, "Frequency Multipliers and Dividers," Microwave Solid State Circuit Design, 2nd Edition, 2003, pp. 393-770, Wiley-Interscience, ISBN 0-471-20755-1, a John Wiley & Sons, Inc. publication.

(Continued)

*Primary Examiner* — Mohammed Rachedine
(74) *Attorney, Agent, or Firm* — Sand, Sebolt & Wernow LPA

(57) ABSTRACT

A frequency multiplier, which may include multiple commutator cells, for multiplying an input signal is provided. A frequency doubler is provided that includes at least one transformer. Each of the at least one transformer includes a primary and a secondary. Each secondary includes a center tap. The frequency doubler further includes at least one commutator cell. Each of the at least one commutator cell includes a first differential pair of input terminals and a second differential pair of input terminals. Each primary is connected to the first pair of differential input terminals and each secondary is connected to the second differential pair of input terminals. The frequency doubler further includes at least one current source and at least one ground. The center tap is connected to the at least one ground via the at least one current source.

20 Claims, 7 Drawing Sheets

(56) References Cited

OTHER PUBLICATIONS

Kumar et al., "A High Performance 20-42 GHz MMIC Frequency Multiplier with Low Input Drive Power and High Output Power," Proceedings of the 1st European Microwave Integrated Circuits Conference, Sep. 2006, pp. 533-536, 2-9600551-8-7 EuMA, Manchester, UK.
Yuan et al., "Compact V Band Frequency Doubler with True Balanced Differential Output," IEEE BCTM 11.3, 2013, pp. 191-194, Ulm, Germany.
Shinjo et al., "Integrating the Front End," IEEE Microwave Magazine, Jun. 6, 2017, pp. 31-40, Jul./Aug. 2017.
International Search Report, PCT/US2019/064486, dated Jan. 17, 2020, 6 pages.

\* cited by examiner

POWER EFFICIENT RADIO FREQUENCY (RF) MULTIPLIERS

TECHNICAL FIELD

The present disclosure relates to systems and methods for communication systems. More particularly, the present disclosure relates to radio frequency (RF) multipliers. Specifically, the present disclosure relates to power efficient RF multipliers with improved performance.

BACKGROUND INFORMATION

Generally, a radio frequency (RF) multiplier is an electronic circuit that generates an output signal whose output frequency is a harmonic of its input frequency. A harmonic is a wave with a frequency that is a positive integer multiple of the frequency of the original wave, known as the fundamental frequency. Frequency multipliers typically include a nonlinear circuit that distorts an input signal and generates harmonics of the input signal. A subsequent bandpass filter typically selects the desired harmonic frequency and removes the unwanted fundamental and other harmonics from the output. The original wave may also be called the first harmonic, and the following harmonics may be referred to as higher harmonics. As all harmonics are periodic at the fundamental frequency, the sum of harmonics is also periodic at that frequency.

One exemplary active RF multiplier is a Gilbert cell-based active frequency doubler which typically utilizes bipolar transistors to operate as a precision multiplier and is typically used in modern communication systems as a multiplier and frequency translator. The Gilbert cell-based active frequency doubler typically utilizes the multiplier circuit to drive an RF port and a local oscillator (LO) port from the same input terminal. The multiplier circuit of the Gilbert cell-based active frequency doubler typically stacks two layers of transistors and current sources, and, therefore, typically requires a high supply voltage in order to suitably operate. Further, the transconductor inputs are typically tied to the fundamental RF signal that also drives the switching core of the Gilbert cell-based active frequency doubler which degrades overall conversion efficiency of the Gilbert cell-based active frequency doubler. Another drawback of Gilbert cell-based active frequency doublers is that the outputs of the Gilbert cell-based active frequency doublers are not adequate in strength to drive RF mixers directly. That is, an amplifier is typically added to the system to drive the RF mixers. Another drawback of Gilbert cell-based active frequency doublers is that they typically do not have sufficient output power to drive cascaded doublers, which typically double the fundamental RF frequency, to make quadruplers, which typically quadruple the fundamental RF frequency. Another drawback of Gilbert cell-based active frequency doublers is excessive degradation of fundamental suppression due to transistor device offset voltages.

SUMMARY

There remains a need in the art for improved active radio frequency (RF) multipliers. The present disclosure addresses these and other issues.

In one aspect, the present disclosure may provide a frequency doubler comprising: at least one transformer; wherein each of the at least one transformer includes a primary and a secondary; wherein the secondary includes a center tap; at least one commutator cell; wherein each of the at least one commutator cell includes a first differential pair of input terminals and a second differential pair of input terminals; wherein the primary is connected to the first pair of differential input terminals; wherein the secondary is connected to the second differential pair of input terminals; at least one current source; and at least one ground; wherein the center tap is connected to the at least one ground via the at least one current source. The frequency doubler further includes a commutator cell bias circuit for biasing the at least one commutator cell.

The first input port of each of the at least one commutator cell may be connected to bipolar junction transistor (BJT) base terminals and the second input port of each of the at least one commutator cell may be connected to BJT emitter terminals.

Alternatively, the first input port of each of the at least one commutator cell may be connected to field effect transistor (FET) gate terminals and the second input port of each of the at least one commutator cell may be connected to FET source terminals.

The frequency doubler further includes a differential input port; wherein the differential input port receives a input signal and a differential output port; wherein the differential output port outputs a second harmonic signal.

The at least one transformer may include a plurality of transformers; wherein each primary of the plurality of transformers is connected in series; wherein the at least one commutator cell includes a plurality of commutator cells; wherein each secondary is connected across one of the plurality of commutator cells; wherein the at least one current source includes a plurality of current sources; wherein the plurality of current sources provides a total commutator cell current to the plurality of commutator cells; and wherein the total commutator cell current is split substantially equally between the plurality of commutator cells.

The frequency doubler further includes a differential input port; wherein the plurality of commutator cells presents a total commutator cell impedance; wherein the total commutator cell impedance is substantially matched to an RF source. The plurality of transformers may modify the total commutator cell impedance.

In another aspect, the present disclosure may provide a system comprising a frequency doubler including at least one transformer; wherein each of the at least one transformer includes a primary and a secondary; wherein the secondary includes a center tap; at least one commutator cell; wherein each of the at least one commutator cell includes a first input port and a second input port; wherein the primary is connected to the first input port; wherein the secondary is connected to the second input port; at least one current source; and at least one ground; wherein the center tap is connected to the at least one ground via the at least one current source; and a radio frequency (RF) device; wherein the frequency doubler drives the RF device.

The RF device may be an RF mixer apparatus. The system may further include a differential input port of the frequency doubler; wherein the differential input port receives a input signal; and a differential output port of the RF mixer apparatus; wherein the differential output port outputs a third harmonic signal. A fundamental signal may be split between the frequency doubler and the RF mixer apparatus.

Alternatively, the frequency doubler may be a first frequency doubler and the RF device may be a second frequency doubler. The system may further include a differential input port of the first frequency doubler; wherein the differential input port receives a input signal; and a differential output port of the second frequency doubler; wherein the differential output port outputs a fourth harmonic signal. Alternatively, the RF device may be a cascaded multiplier.

In another aspect, the present disclosure may provide a frequency multiplier, which may include multiple commutator cells, for multiplying an input signal. The frequency doubler includes at least one transformer. Each of the at least one transformer includes a primary and a secondary. Each secondary includes a center tap. The frequency doubler further includes at least one commutator cell. Each of the at least one commutator cell includes a first differential pair of input terminals and a second differential pair of input terminals. Each primary is connected to the first pair of differential input terminals and each secondary is connected to the second differential pair of input terminals. The frequency doubler further includes at least one current source and at least one ground. The center tap is connected to the at least one ground via the at least one current source. The frequency doubler includes at least one transformer. Each of the at least one transformer includes a primary and a secondary. Each secondary includes a center tap. The frequency further includes at least one commutator cell. Each of the at least one commutator cell includes a first differential pair of input terminals and a second differential pair of input terminals. Each primary is connected to the first pair of differential input terminals and each secondary is connected to the second differential pair of input terminals. The frequency doubler further includes at least one current source and at least one ground. The center tap is connected to the at least one ground via the at least one current source.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
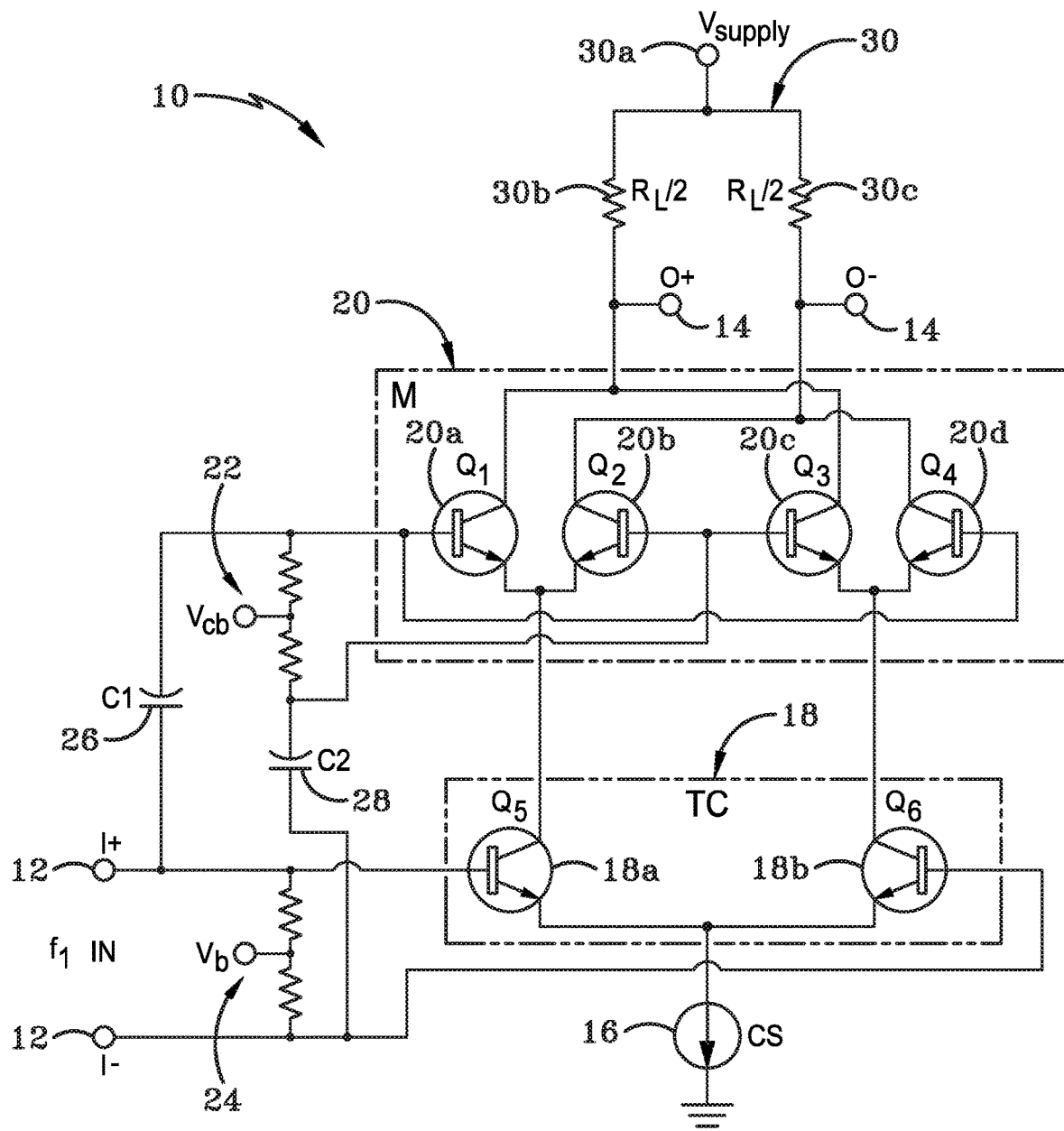
FIG. 1 is a schematic diagram of a conventional Gilbert cell-based active frequency doubler.

FIG. 1 illustrates a schematic view of a PRIOR ART Gilbert cell-based active frequency doubler 10, which may also be referred to as a Gilbert cell-based frequency multiplier. The Gilbert cell-based active frequency doubler 10 includes a differential input port 12, a differential output port 14, a current source 16, a transconductor 18, a multiplying mechanism 20, a multiplying mechanism bias circuit 22, a transconductor bias circuit 24, a first blocking capacitor 26, a second blocking capacitor 28, and a load mechanism 30.

The transconductor 18 includes a first transistor 18a and a second transistor 18b. The multiplying mechanism 20 includes a first transistor 20a, a second transistor 20b, a third transistor 20c and a fourth transistor 20d. The load mechanism 30 includes a voltage supply 30a, a first resistor 30b, and a second resistor 30c.

The base of the first transistor 18a is connected to one terminal of the differential input port 12 and the base of the second transistor 20b is connected to the other terminal of the input port 12. The emitter of the first transistor 18a is connected to the current source 16 and the emitter of the second transistor 18b. The emitter of the second transistor 18b is connected to the current source 16. The collector of the first transistor 18a is connected to the emitters of the first transistor 20a and the second transistor 20b. The collector of the second transistor 20b is connected to the emitter of the third transistor 20c and the fourth transistor 20d. The emitter of the first transistor 20a is connected to the emitter of the second transistor 20b. The emitter of the third transistor 20c is connected to the emitter of the fourth transistor 20d. The base of the first transistor 20a is connected to the base of the fourth transistor 20d and to the multiplying mechanism bias circuit 22. The base of the second transistor 22b is connected to the base of the third transistor 22c and to the multiplying mechanism bias circuit 22. The collector of the first transistor 22a is connected to the collector of the third transistor 22c and to one terminal of the differential output port 14. The collector of the second transistor 22b is connected to the collector of the fourth transistor 22d and to the other terminal of the differential output port 14. The first resistor 30b is connected to one terminal of the differential output port 14 and the voltage supply 30a. The second resistor 30c is connected to the other terminal of the differential output port 14 and the voltage supply 30a.

The operation of the Gilbert cell-based active frequency doubler 10 is well known and, for brevity purposes, will not be discussed herein; however, and as stated in the Background above, the Gilbert cell-based active frequency doubler 10 has some shortcomings.

Figure 2:
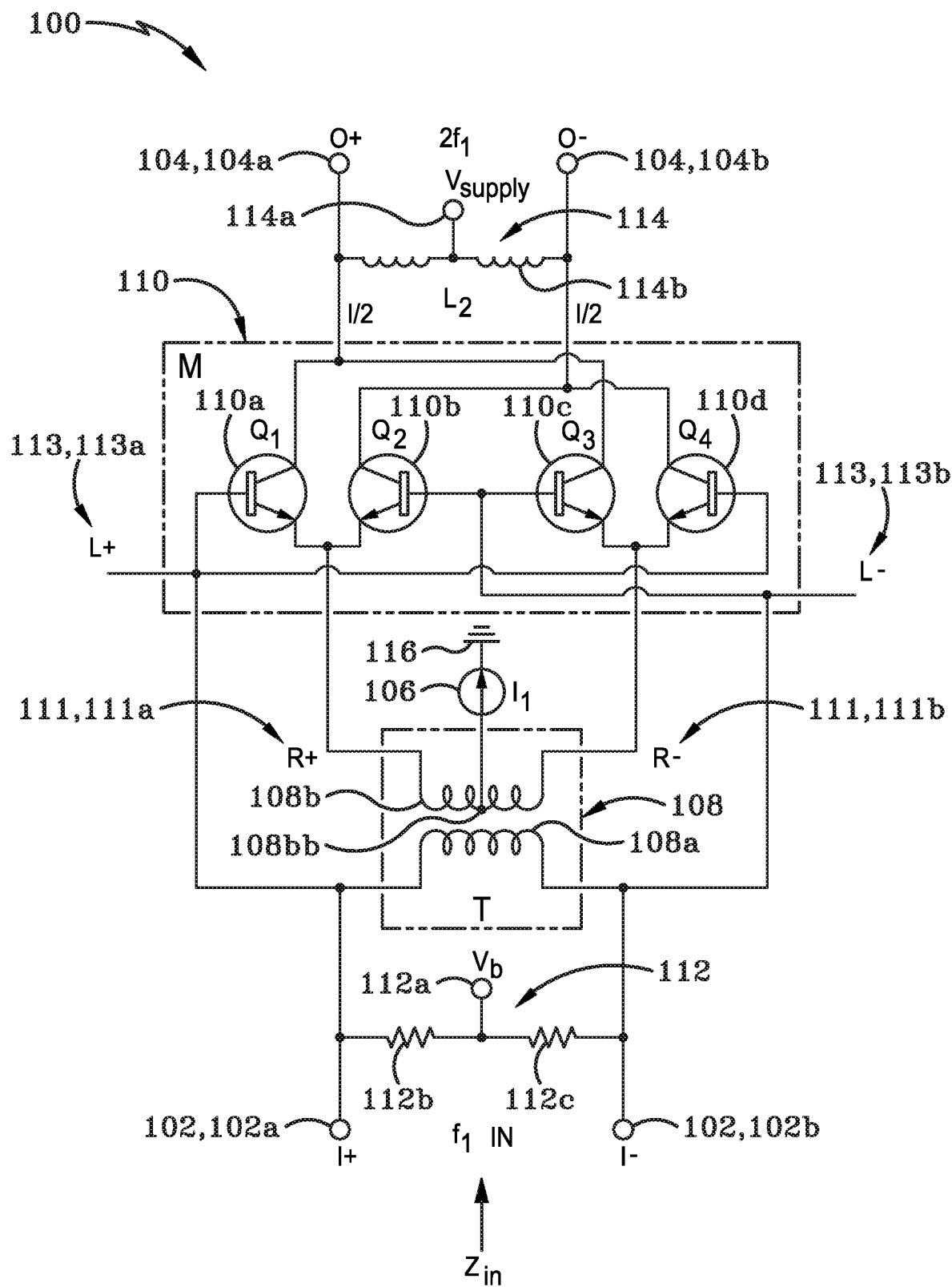
FIG. 2 is a schematic diagram of one embodiment of an active frequency doubler in accordance with one aspect of the present disclosure.

FIG. 2 is a schematic view of one embodiment of an active frequency doubler 100 in accordance with one aspect of the present disclosure. The active frequency doubler 100 includes a differential input port 102 having a first input terminal 102a, which may also be referred to as the I+ input terminal, and a second input terminal 102b, which may also be referred to as the I− input terminal, a differential output port 104 having a first output terminal 104a, which may also be referred to as the O+ output terminal, and a second output terminal 104b, which may also be referred to as the O− output terminal, a current source 106, a transformer 108, a multiplying mechanism 110, which may also be referred to as a multiplying core, multiplying quad, multiplying core, commutator cell, a multiplying mechanism bias circuit 112, which may also be referred to as a multiplying core bias circuit, commutating quad bias circuit, commutator cell bias circuit, multiplying quad bias circuit or quad core bias circuit, a load mechanism 114 and a ground 116.

In one particular embodiment, the commutator cell 110 includes a first transistor 110a, a second transistor 110b, a third transistor 110c and a fourth transistor 110d, a differential voltage radio frequency (RF) input port 111 having a first RF input terminal 111a, which may also be referred to as the $RF_p$ input terminal, and a second RF input terminal 111b, which may also be referred to as the $RF_m$ input terminal, and a differential voltage local oscillator (LO) input port 113 having a first LO input terminal 113a, which may also be referred to as the $LO_p$ input terminal, and a second LO input terminal 113b, which may also be referred to as the $LO_m$ input terminal. The differential voltage RF input port 111 having the first RF input terminal 111a and the second RF input terminal 111b may be referred to as a first input port or a second input port of the commutator cell 110. Likewise, the differential voltage LO input port 113 having the first LO input terminal 113a and the second LO input terminal 113b may be referred to as a first input port or a second input port of the commutator cell 110. The commutator cell 110 may be a bipolar junction transistor (BJT) multiplier; however the commutator cell 110 may be any suitable multiplying mechanism. Further, the commutator cell 110 may utilize any suitable transistors including, but not limited to, bipolar transistors, bipolar junction transistors (BJTs), field effect transistors (FETs), n-type field effect transistors (nFETs), pseudomorphic high-electron mobility transistors (pHEMTs), metal-semiconductor field-effect transistors (MESFETs) and gallium nitride (GaN) transistors.

In one particular embodiment, the commutator cell bias circuit 112 includes a voltage supply 112a, a first resistor 112b, and a second resistor 112c. In one particular embodiment, the load mechanism 114 includes a voltage supply 114a and an inductor 114b having a center tap 114bb.

In one particular embodiment, the primary 108a of the transformer 108 is connected to the first input terminal 102a, the second input terminal 102b, the bases of the first transistor 110a, the second transistor 110b, the third transistor 110c and the fourth transistor 110d, the first LO input terminal 113a, and the second LO input terminal 113b. In one particular embodiment, the secondary 108b of the transformer 108 is connected to the current source 106 via center tap 108bb, the first RF input terminal 111a, and the second RF input terminal 111b. The first transformer 108 may be a 1:1 planar transformer; however, any suitable transformers may be utilized, such as planar spiral transformers, wire-wound transformers, slab transformers, and the like. It should be noted that the selection of the type of transformers may be dependent, at least in part, on the desired operational frequencies of the active frequency doubler 100 of the present disclosure.

In one particular embodiment, the voltage supply 112a of the commutator cell bias circuit 112 is connected to the first resistor 112b and the second resistor 112c. The first resistor 112b is connected to the first input terminal 102a and the second resistor is connected to the second input terminal 102b. The commutator cell bias circuit 112 provides a bias voltage to the commutator cell 110. The first resistor 112b and the second resistor 112c may be equal and larger than an RF input impedance $Z_{in}$ entering the active frequency doubler 100 such that the active frequency doubler 100 does not suffer any loss.

In one particular embodiment, the base of the first transistor 110a is connected to the base of the fourth transistor 110d. The base of first transistor 110a and the base of the fourth transistor 110d are operatively connected to the first LO input terminal 113a and the primary 108a of the transformer 108. The base of the second transistor 110b is connected to the base of the third transistor 110c. The base of second transistor 110b and the base of the third transistor 110c are operatively connected to the second LO input terminal 113b and the primary 108a of the transformer 108. Stated otherwise, the first LO input terminal 113a and the second LO input terminal 113b may form the first input of the commutator cell 110 and the first input of the commutator cell 110 may be connected to the base terminals of the first transistor 110a, the second transistor 110b, the third transistor 110c, and the fourth transistor 110d. If field effect transistors (FETs) are being utilized instead of bipolar junction transistors (BJTs), the first LO input terminal 113a and the second LO input terminal 113b may form the first input of the commutator cell 110 and the first input of the commutator cell 110 may be connected to the gate terminals of the first transistor 110a, the second transistor 110b, the third transistor 110c, and the fourth transistor 110d. Although the first LO input terminal 113a and the second LO input terminal 113b are referred to as forming the first input port, it is to be understood that the first LO input terminal 113a and the second LO input terminal 113b may be referred to as forming a second input of the commutator cell 110. In one particular embodiment, the emitter of the first transistor 110a is connected to the emitter of the second transistor 110b. The emitter of the first transistor 110a and the emitter of the second transistor 110b are operatively connected to the first RF input terminal 111a. The emitter of the third transistor 110c is connected to the emitter of the fourth transistor 110d. The emitter of the third transistor 110c and the emitter of the fourth transistor 110d are operatively connected to the second RF input terminal 111b. Stated otherwise, the first RF input terminal 111a and the second RF input terminal 111b may form the second input port of the commutator cell 110 and the second input port of the commutator cell 110 may be connected to the emitter terminals of the first transistor 110a, the second transistor 110b, the third transistor 110c, and the fourth transistor 110d. If field effect transistors (FETs) are being utilized instead of bipolar junction transistors (BJTs), the first RF input terminal 111a and the second RF input terminal 111b may form the second input port of the commutator cell 110 and the second input port of the commutator cell 110 may be connected to the source terminals of the first transistor 110a, the second transistor 110b, the third transistor 110c, and the fourth transistor 110d. Although the first RF input terminal 111a and the second RF input terminal 111b are referred to as forming the second input port, it is to be understood that the first RF input terminal 111a and the second RF input terminal 111b may be referred to as forming a first input port of the commutator cell 110. In one particular embodiment, the collector of the first transistor 110a is connected to the collector of the third transistor 110c and to the first output terminal 104a. The collector of the second transistor 110b is connected to the collector of the fourth transistor 110d and to the second output terminal 104b. The inductor 114b is connected to the first output terminal 104a, the second output terminal 104b and the voltage supply 114a. The voltage supply 114a supplies voltage to the commutator cell 110.

In operation, a fundamental RF input signal $f_1$ is fed to the differential voltage RF input port 111 and the differential voltage local oscillator (LO) input port 113 of the commutator cell 110 through the differential input port 102. Stated otherwise, the differential input port 102 directly drives the differential voltage LO input port 113 and the fundamental RF input signal $f_1$ drives the RF input port 111 via the transformer 108. The commutator cell bias circuit provides a bias to the commutator cell 110. The fundamental RF input signal $f_1$ is multiplied to a second harmonic RF output signal $2f_1$.

In one example, the architecture of the active frequency doubler 100 provides improved direct current (DC) to RF efficiency compared to conventional active frequency multipliers including the PRIOR ART Gilbert cell-based active frequency doubler 10. The architecture of the active frequency doubler 100 provides suitable power output to drive other RF devices, including, but not limited to, RF mixers, cascaded multipliers, frequency doublers and frequency triplers, which obviates the need to design and provide an amplifier mechanism at a second harmonic, or any other suitable harmonic, to drive an RF device, such as an RF mixer or another frequency doubler to make frequency quadruplers, or any other suitable multiplier. The need for higher power output from frequency doublers is becoming a typical design parameter in 5G wireless communications, multiple-input and multiple-output (MIMO), which is a method for multiplying the capacity of a radio link using multiple transmit and receive antennas to exploit multipath propagation, among other applications. Applications such as 5G wireless communications utilize frequency multipliers that drive quadrature polyphase lossy filters that typically require buffer amplifiers. In 5G wireless communication systems, many antennas are utilized for beam forming which requires operation at second and fourth harmonics of the fundamental oscillator. Another benefit of the present disclosure is that the active frequency doublers 100 operate at low voltage, such as, for example, two volts.

Figure 3:
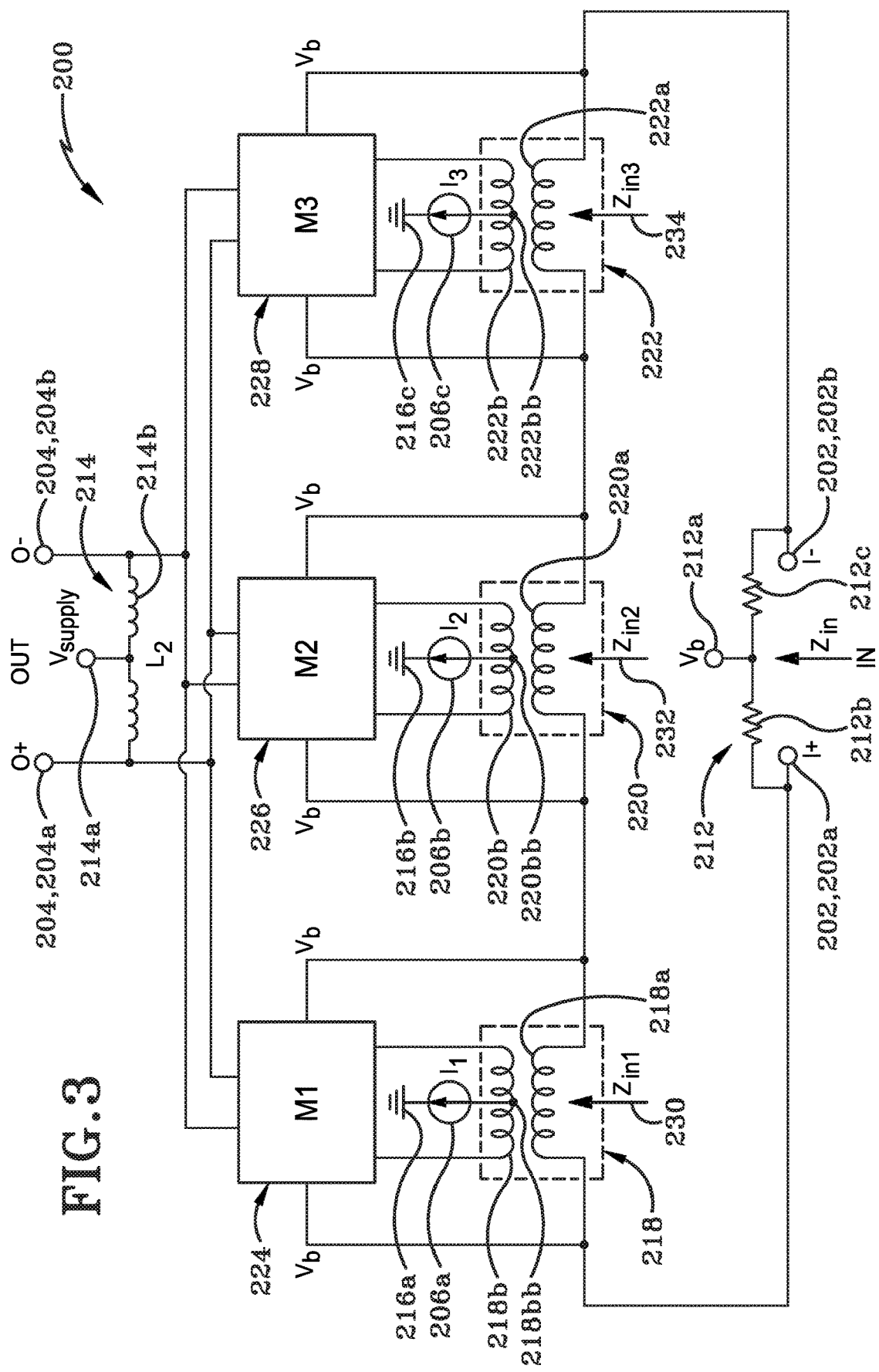
FIG. 3 is a schematic diagram of one embodiment of an active frequency doubler in accordance with one aspect of the present disclosure.

FIG. 3 is a schematic view of one embodiment of an active multi-commutator-cell frequency doubler 200 in accordance with one aspect of the present disclosure. The active multi-commutator-cell frequency doubler 200 is substantially identical to the active frequency doubler 100 of FIG. 2 in structure and function with a few exceptions/additions that will be discussed hereafter in greater detail. As will be described in greater detail below, the active multi-commutator-cell frequency doubler 200 includes three commutator cells instead of a single commutator cell. The active multi-commutator-cell frequency doubler 200 splits an input signal voltage evenly between the three commutator cells and an output of each cell is combined in parallel. Although the active multi-commutator-cell frequency doubler 200 includes three commutator cells, it is to be entirely understood that the active multi-commutator-cell frequency doubler 200 may utilize any suitable number of commutator cells.

The similarities and differences between the active frequency doubler 100 of FIG. 2 and the active multi-commutator-cell frequency doubler 200 will be further described herein. Similar to the active frequency doubler 100, and in one particular embodiment, the active multi-commutator-cell frequency doubler 200 includes a differential input port 202 having a first input terminal 202a, which may also be referred to as the I+ input terminal, and a second input terminal 202b, which may also be referred to as the I− input terminal, a differential output port 204 having a first output terminal 204a, which may also be referred to as the O+ output terminal, a second output terminal 204b, which may also be referred to as the O− output terminal, a multiplying mechanism bias circuit 212, which may also be referred to as a multiplying core bias circuit, commutating quad bias circuit, commutator cell bias circuit, multiplying quad bias circuit or quad core bias circuit, and a load mechanism 214.

In contrast to the active frequency doubler 100, and in one particular embodiment, instead of including a single ground, the active multi-commutator-cell frequency doubler 200 includes a first ground 216a, a second ground 216b, and a third ground 216c.

In contrast to the active frequency doubler 100, and in one particular embodiment, instead of including a single current source, the active multi-commutator-cell frequency doubler 200 includes a first current source 206a, a second current source 206b, and a third current source 206c.

In contrast to the active frequency doubler 100, and in one particular embodiment, instead of including a single transformer, the active multi-commutator-cell frequency doubler 200 includes a first transformer 218, a second transformer 220, and a third transformer 222. The first transformer 218 includes a primary 218a and a secondary 218b which includes a center tap 218bb. The second transformer 220 includes a primary 220a and a secondary 220b which includes a center tap 220bb. The third transformer 222 includes a primary 222a and a secondary 222b which includes a center tap 218bb. The first transformer 218, the second transformer 220, and the third transformer 222 may be 1:1 planar transformers; however, any suitable transformers may be utilized, such as planar spiral transformers, wire-wound transformers, slab transformers, and the like. It should be noted that the selection of the type of transformers may be dependent, at least in part, on the desired operational frequencies of the active multi-commutator-cell frequency doubler 200 of the present disclosure.

In contrast to the active frequency doubler 100, and in one particular embodiment, instead of including a single commutator cell, the active multi-commutator-cell frequency doubler 200 includes a first commutator cell 224, a second commutator cell 226, and a third commutator cell 228. The first commutator cell 224, the second commutator cell 226, and the third commutator cell 228 are substantially identical to the commutator cell 110 of FIG. 2; however, some components are not shown for clarity in FIG. 3. For example, the components of the commutator cell 110 of FIG. 2 corresponding to the components of the first commutator cell 224, the second commutator cell 226, and the third commutator cell 228, such as the first transistor 110a, the second transistor 110b, the third transistor 110c and the fourth transistor 110d, the differential voltage radio frequency (RF) input port 111 having the first RF input terminal 111a and the second RF input terminal 111b, and the differential voltage local oscillator (LO) input port 113 having the first LO input terminal 113a and the second LO input terminal 113b are not shown in FIG. 3, however, it is to be understood that the first commutator cell 224, the second commutator cell 226, and the third commutator cell 228 include all necessary components even if they are not described in detail herein. The active multi-commutator-cell frequency doubler 200 further shows a first commutator cell impedance 230, or $Z_{in1}$, looking into the first commutator cell 224 and seen by the first transformer 218, which is a 1:1 transformer, across its primary 218a terminals. The active multi-commutator-cell frequency doubler 200 further shows a second commutator cell impedance 232, or $Z_{in2}$, looking into the second commutator cell 226 and seen by the second transformer 220, which is a 1:1 transformer, across its primary 220a terminals. The active multi-commutator-cell frequency doubler 200 further shows a third commutator cell impedance 234, or $Z_{in3}$, looking into the third commutator cell 228 and seen by the third transformer 222, which is a 1:1 transformer, across its primary 222a terminals.

In one particular embodiment, the commutator cell bias circuit 212 includes a voltage supply 212a, a first resistor 212b, and a second resistor 212c. In one particular embodiment, the load mechanism 214 includes a voltage supply 214a and an inductor 214b having a center tap 214bb.

In contrast to the active frequency doubler 100, and in one particular embodiment, instead of the primary 108a of the transformer 108 being connected to the first input terminal 102a and the second input terminal 102b, the primary 218a of the first transformer is connected to the first input terminal 202a and the primary 220a of the second transformer 220 in series. The primary 220a of the second transformer 220 is connected to the primary 222a of the third transformer 222 in series and the primary 222a of the third transformer 222 is connected to the second input terminal 202b. Therefore, and as stated above, the input signal voltage is split evenly between the first commutator cell 224, the second commutator cell 226, and the third commutator cell 228.

In one particular embodiment, the voltage supply 212a of the commutator cell bias circuit 212 is connected to the first resistor 212b and the second resistor 212c. The first resistor 212b is connected to the first input terminal 202a and the second resistor is connected to the second input terminal 202b. In this embodiment, the commutator cell bias circuit 212 provides a bias voltage to the first commutator cell 224, the second commutator cell 226, and the third commutator cell 228. The first resistor 212b and the second resistor 212c may be equal and larger than an RF input impedance $Z_{in}$ entering the active multi-commutator-cell frequency doubler 200 such that the active multi-commutator-cell frequency doubler 200 does not suffer any loss.

The output of the first commutator cell 224, the second commutator cell 226, and the third commutator cell 228 may be connected in parallel to the first output terminal 204a and the second output terminal 204b.

In operation, a fundamental RF input signal $f_1$ is split by the first transformer 218, the second transformer 220, and the third transformer 222 and fed to the differential voltage RF input ports and the differential voltage local oscillator (LO) input ports of the first commutator cell 224, the second commutator cell 226, and the third commutator cell 228 through the differential input port 202. Stated otherwise, the differential input port 202 directly drives the differential voltage LO input ports and the fundamental RF input signal f1 drives the RF input terminals via the first transformer 218, the second transformer 220, and the third transformer 222. The commutator cell bias circuit 212 provides a bias to the first commutator cell 224, the second commutator cell 226, and the third commutator cell 228. The fundamental RF input signal f1 is multiplied to a second harmonic RF output signal $2f_1$.

Figure 4:
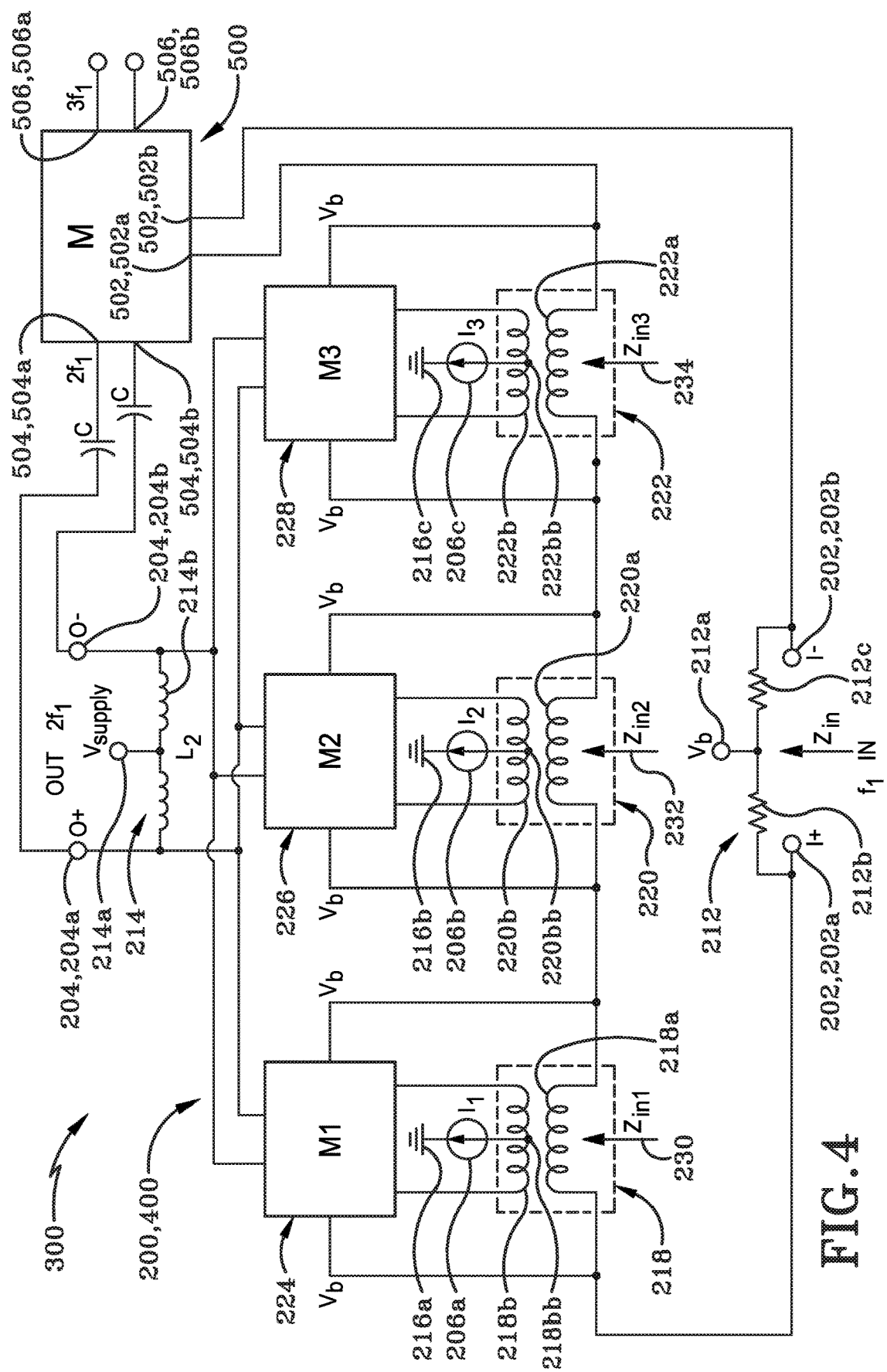
FIG. 4 is a schematic diagram of one embodiment of an active frequency doubler in accordance with one aspect of the present disclosure connected to a radio frequency (RF) mixer apparatus.

FIG. 4 is a schematic view of one embodiment of an active multi-commutator-cell frequency tripler 300 in accordance with one aspect of the present disclosure. The active multi-commutator-cell frequency tripler 300 utilizes an active multi-commutator-cell frequency doubler 400 that is substantially identical to the active multi-commutator-cell frequency doubler 200 of FIG. 3 in structure and function to drive an RF mixer apparatus 500. The reference numerals associated with the components of the active multi-commutator-cell frequency doubler 400 are the same as the reference numerals associated with the components of the active multi-commutator-cell frequency doubler 200. The RF mixer apparatus 500 may be any suitable RF mixer. In one particular embodiment, the RF mixer apparatus 500 includes a differential RF input port 502 having a first RF input terminal 502a and a second RF input terminal 502b, a differential voltage LO input port 504 having a first LO input terminal 504a and a second LO input terminal 504b, and a differential voltage intermediate frequency (IF) output terminal 506 having a first IF output terminal 506a and a second IF output terminal 506b. The first RF input terminal 502a is connected to the first input terminal 202a and the second RF input terminal is connected to the second input terminal 202b. The first LO input terminal 504a is connected to the first output terminal 204a and the second LO input terminal 504b is connected to the second output terminal 204b.

In operation, the active multi-commutator-cell frequency doubler 400 drives the RF mixer apparatus 500. Thus, a fundamental RF input signal $f_1$ is shared by the active multi-commutator-cell frequency doubler 400 and the RF mixer apparatus 500. The fundamental RF input signal $f_1$ is split by the first transformer 218, the second transformer 220, and the third transformer 222 and fed to the differential voltage RF input ports and the differential voltage local oscillator (LO) input ports of the first commutator cell 224, the second commutator cell 226, and the third commutator cell 228 through the differential input port 202. Stated otherwise, the differential input port 202 directly drives the differential voltage LO input ports and the fundamental RF input signal f1 drives the RF input terminals via the first transformer 218, the second transformer 220, and the third transformer 222. The commutator cell bias circuit 212 provides a bias to the first commutator cell 224, the second commutator cell 226, and the third commutator cell 228. The fundamental RF input signal f1 is multiplied to a second harmonic RF output signal $2f_1$. The second harmonic RF output signal $2f_1$ enters the first LO input terminal 504a and the second LO input terminal 504b of the RF mixer and the fundamental signal $f_1$ enters the first RF input terminal 502a and a second RF input terminal 502b. RF mixer apparatus 500 mixes the second harmonic RF output signal $2f_1$ with the fundamental signal $f_1$ and provides a third harmonic RF output signal $3f_1$ through the first IF output terminal 506a and the second IF output terminal 506b.

Figure 5:
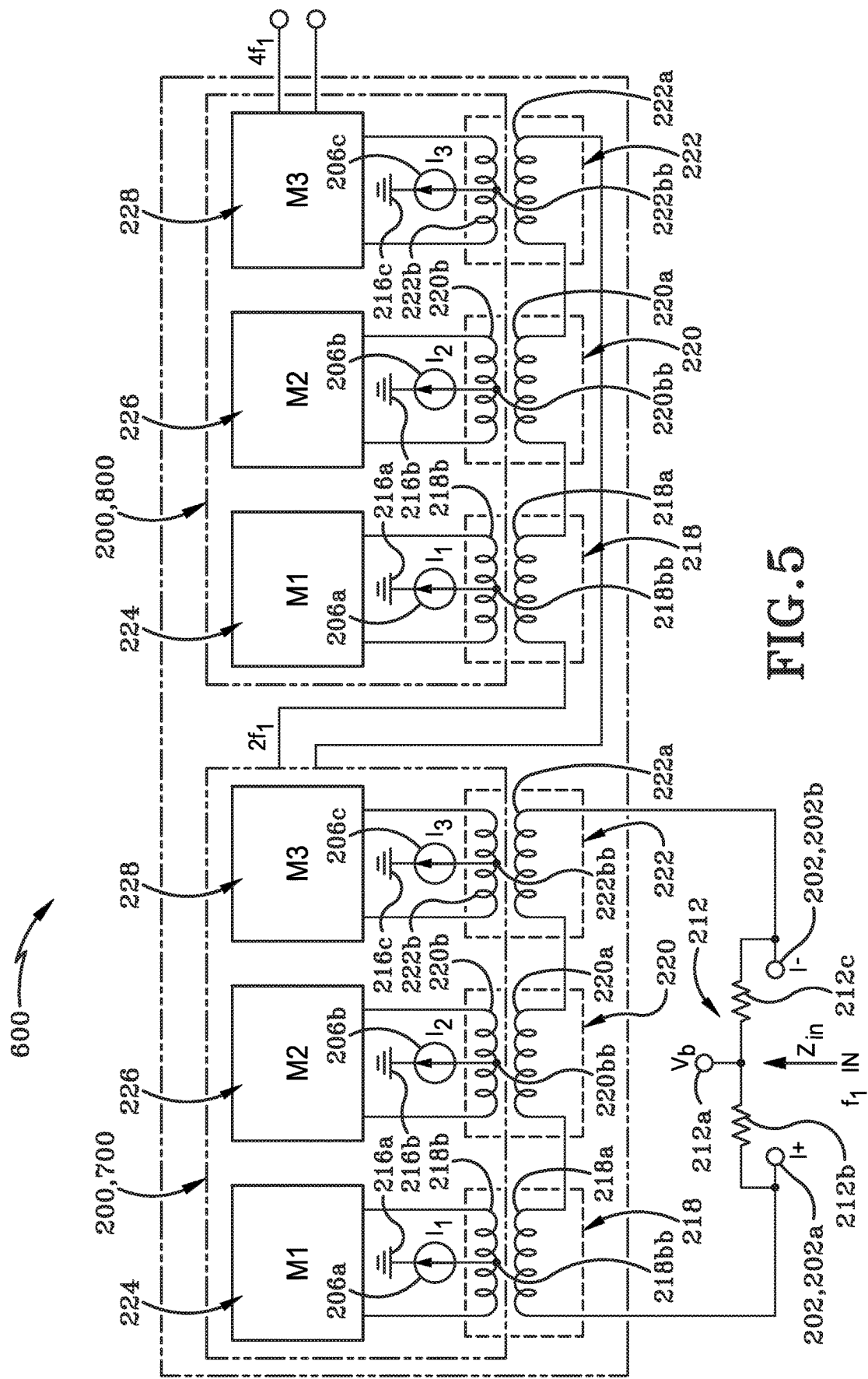
FIG. 5 is a schematic diagram of one embodiment of a first active frequency doubler connected to a second active frequency doubler in accordance with one aspect of the present disclosure.

FIG. 5 is a schematic view of one embodiment of an active multi-commutator-cell frequency quadrupler 600 in accordance with one aspect of the present disclosure. The active multi-commutator-cell frequency quadrupler 600 utilizes a first active multi-commutator-cell frequency doubler 700 and a second active multi-commutator-cell frequency doubler 800 that are substantially identical to the active multi-commutator-cell frequency doubler 200 of FIG. 3 in structure and function; however, some of the components have been removed for clarity from FIG. 5. The first active multi-commutator-cell frequency doubler 700 may drive the second active multi-commutator-cell frequency doubler 800.

In operation, the first active multi-commutator-cell frequency doubler 700 operates in a substantially identical manner as operation of the active multi-commutator-cell frequency doubler 200 of FIG. 3 to multiply a fundamental RF input signal $f_1$ to produce a second harmonic RF output signal $2f_1$. The second harmonic RF output signal is fed from the first active multi-commutator-cell frequency doubler 700 to the second active multi-commutator-cell frequency doubler 800 and the second active multi-commutator-cell frequency doubler 800 operates in a substantially identical manner as operation of the active multi-commutator-cell frequency doubler 200 of FIG. 3 to produce a fourth harmonic RF output signal $4f_1$. Stated otherwise, the fundamental RF input signal $f_1$ is multiplied to the second harmonic RF output signal $2f_1$ which becomes a second harmonic RF input signal $2f_1$ to the second active multi-commutator-cell frequency doubler 800. The second harmonic RF input signal $2f_1$ is multiplied to the fourth harmonic RF output signal $4f_1$.

Figure 6:
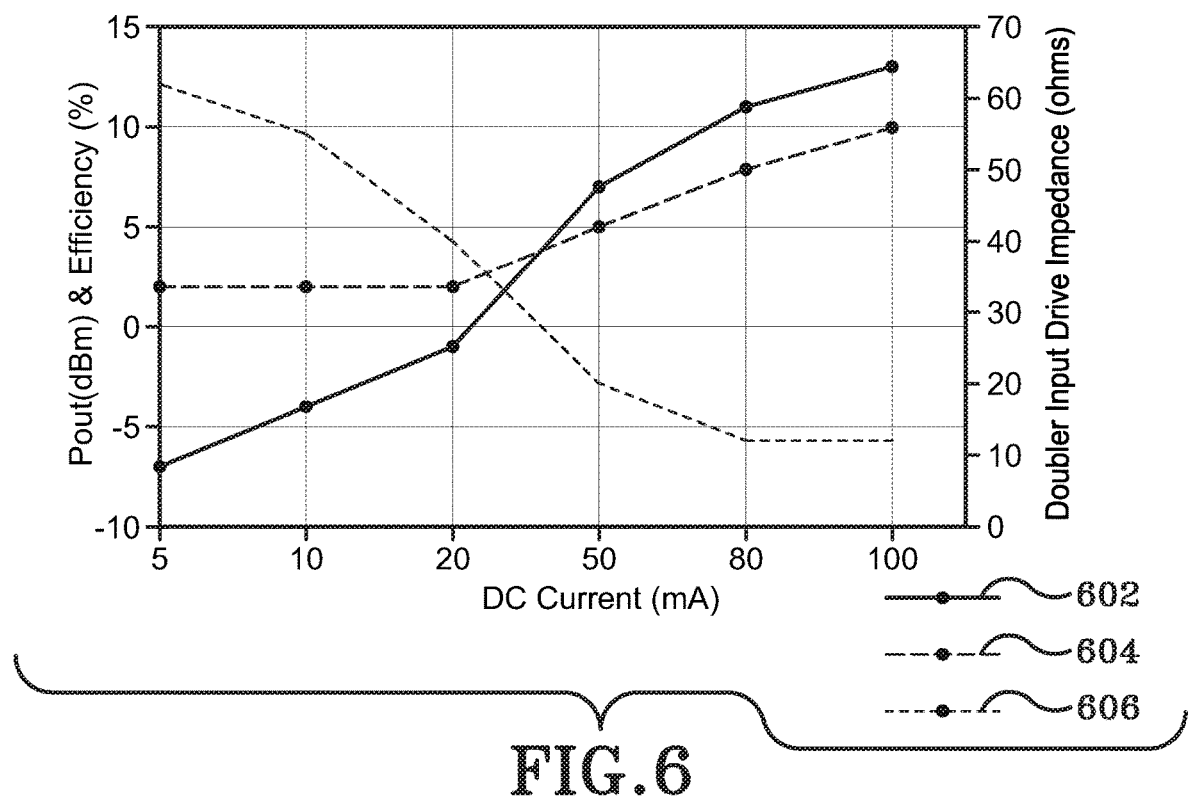
FIG. 6 is a graph of power output in decibel-milliwatts (dBm) and efficiency percentage on one y-axis and input drive impedance in ohms on a second y-axis versus direct current (DC) current in milliamps (mA) for an active single-commutator-cell frequency doubler in accordance with the present disclosure.

FIG. 6 is a graph of power output, Pout, in decibel-milliwatts (dBm) and efficiency percentage on one y-axis and doubler input drive impedance, which may also be referred to as active single-commutator-cell frequency doubler input drive impedance, in ohms on a second y-axis versus DC current in mA for a 22-44 gigahertz (GHz) active single-commutator-cell frequency doubler in accordance with the present disclosure. The input drive impedance is the amplitude of the voltage of the fundamental signal divided by the amplitude of the current of the fundamental signal at the input port of the active frequency doubler. The efficiency percentage is defined as the power output divided by the DC power input. Line 602 represents power output of the active single-commutator-cell frequency doubler of the present disclosure in dBm, line 604 represents the efficiency of the active single-commutator-cell frequency doubler of the present disclosure as a percentage, and line 606 represents the input impedance of the active single-commutator-cell frequency doubler of the present disclosure in ohms. As shown in FIG. 6, the active single-commutator-cell frequency doubler input drive impedance decreases as the power output increases and the efficiency of the active single-commutator-cell frequency doubler increases as the power output increases.

Figure 7:
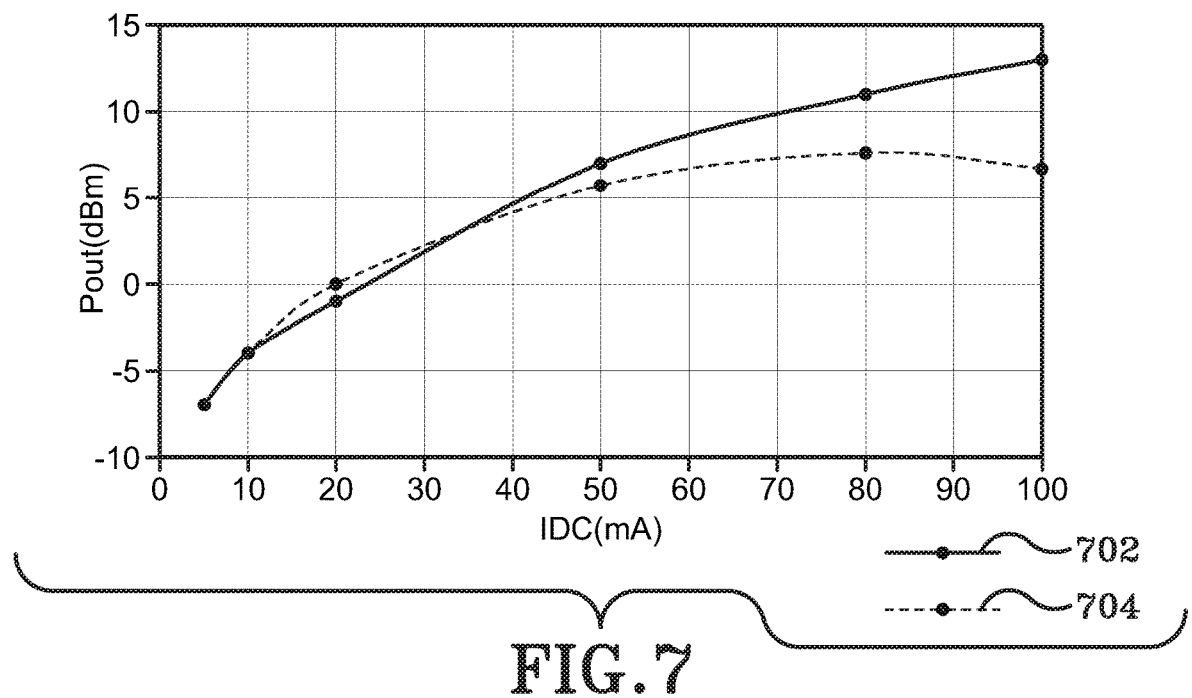
FIG. 7 is a graph of power output in dBm versus DC current input in mA for the PRIOR ART Gilbert cell-based active frequency doubler and an active single-commutator-cell frequency doubler in accordance with the present disclosure.

FIG. 7 is a graph of peak second harmonic power output, Pout, in dBm versus DC current input, IDC, in mA for the PRIOR ART 22-44 GHz Gilbert cell-based active frequency doubler 10 and a 22-44 GHz active single-commutator-cell frequency doubler of the present disclosure. Line 702 represents the power output of the active single-commutator-cell frequency doubler of the present disclosure in dBm and line 704 represents the power output of the PRIOR ART 22-44 GHz Gilbert cell-based active frequency doubler 10 in dBm. As shown in FIG. 7, the power output of the 22-44 GHz active single-commutator-cell frequency doubler of the present disclosure is greater than the power output of the PRIOR ART 22-44 GHz Gilbert cell-based active frequency doubler 10. Specifically, the ability of the PRIOR ART 22-44 GHz Gilbert cell-based active frequency doubler 10 to deliver second harmonic power is limited to seven dBm at eighty mA. However, the 22-44 GHz active single-commutator-cell frequency doubler of the present disclosure has a steady increase of power delivered at the second harmonic with an increase of DC. Further, output power as high as thirteen dBm at one hundred mA is demonstrated. The 22-44 GHz active single-commutator-cell frequency doubler of the present disclosure has an input impedance of twelve ohms. The output power capability of the 22-44 GHz active single-commutator-cell frequency doubler of the present disclosure can be further improved by using multiple cells which allow the impedance to be matched simultaneously to a fifty ohm RF source. The power output of the PRIOR ART 22-44 GHz Gilbert cell-based active frequency doubler 10 cannot be increased by increasing the current. The power output of the 22-44 GHz active single-commutator-cell frequency doubler of the present disclosure increases by increasing the current. Specifically, the peak power of the PRIOR ART 22-44 GHz Gilbert cell-based active frequency doubler 10 is seven dBm (i.e., five milliwatts (mW)) at eighty mA. Even at one hundred mA, the 22-44 GHz active single-commutator-cell frequency doubler of the present disclosure can deliver thirteen dBm of power output (i.e., twenty mW). The PRIOR ART 22-44 GHz Gilbert cell-based active frequency doubler 10 uses a four volt supply while the 22-44 GHz active single-commutator-cell frequency doubler of the present disclosure uses a two volt supply. The efficiency of the PRIOR ART 22-44 GHz Gilbert cell-based active frequency doubler 10 is 5 mW/(4*80 mA)=5/320=1.5625 or approximately 1.6%. The efficiency of the 22-44 GHz active single-commutator-cell frequency doubler of the present disclosure is 20 mW/(2*100 mA)=20/200=0.1 or 10%, which is shown in FIG. 6.

The active frequency doublers of the present disclosure have improved power output and improved input impedance matching compared to conventional frequency multipliers or doublers, such as the PRIOR ART Gilbert cell-based active frequency doubler 10. Another advantage of the active multi-commutator-cell frequency doublers of the present disclosure compared to conventional frequency multipliers or doublers is that the active multi-commutator-cell frequency doublers of the present disclosure dissipate less heat per device.

Figure 8:
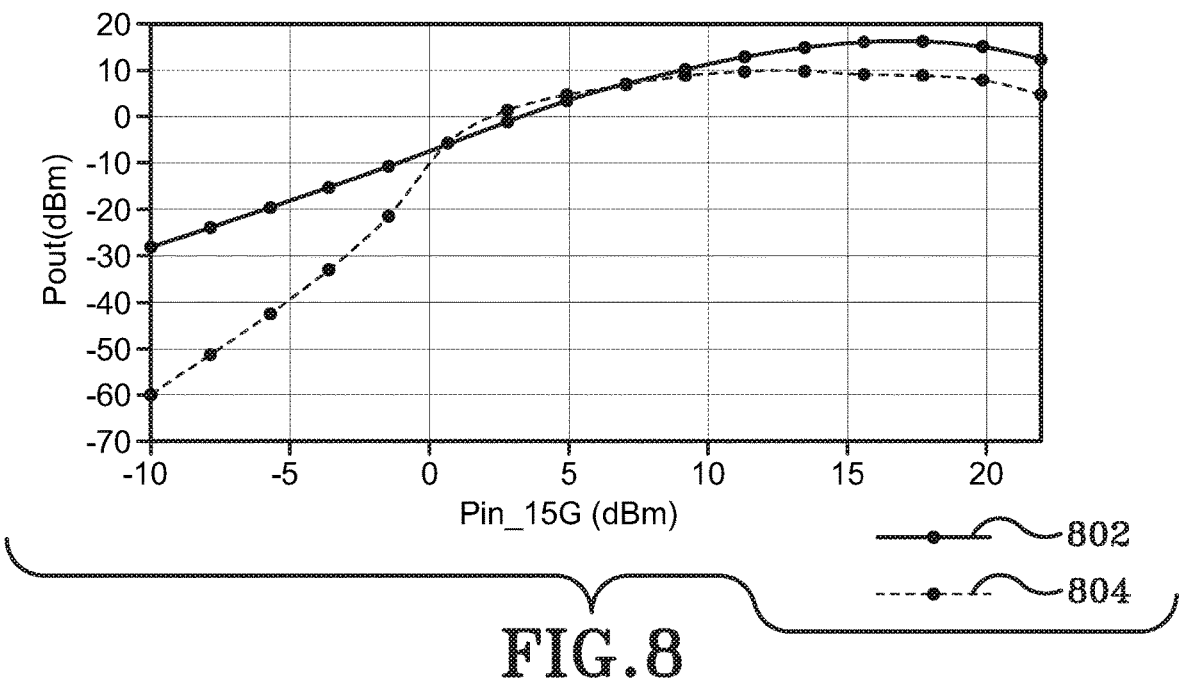
FIG. 8 is a graph of power output in dBm versus power input for an active two-commutator-cell frequency doubler and an active multi-commutator-cell frequency quadrupler in accordance with one aspect of the present disclosure.

In one particular embodiment, increasing the number of commutator cells allows improved matching of the input impedance entering the active multi-commutator-cell frequency doublers in accordance with the present disclosure. For example, and not meant as a limitation, a two-commutator-cell active frequency doubler has an approximately twenty-five ohm input impedance at 100 mA for each cell. Further, and in one particular embodiment, as additional cells are added to the active frequency doublers of the present disclosure, and as larger currents are utilized within the active frequency doublers of the present disclosure, larger power outputs are generated. For example, and not meant as a limitation, an active single-commutator-cell frequency doubler provides approximately thirteen dBm output while consuming one hundred mA DC. In another example, and not meant as a limitation, an active two-commutator-cell frequency doubler provides approximately seventeen dBm of power output while each commutator cell consumes one hundred twenty mA DC. FIG. 8 is a graph of power output, Pout, in dBm versus power input, Pin_15G, where the power input is fifteen GHz for an active two-commutator-cell frequency doubler and an active multi-commutator-cell frequency quadrupler which utilizes a first two-commutator-cell frequency doubler to drive a second two-commutator-cell frequency doubler without utilizing an amplifier. Line 802 represents the power output in dBm of the active two-commutator-cell frequency doubler and line 804 represents the power output in dBm of the multi-commutator-cell frequency quadrupler.

Figure 9:
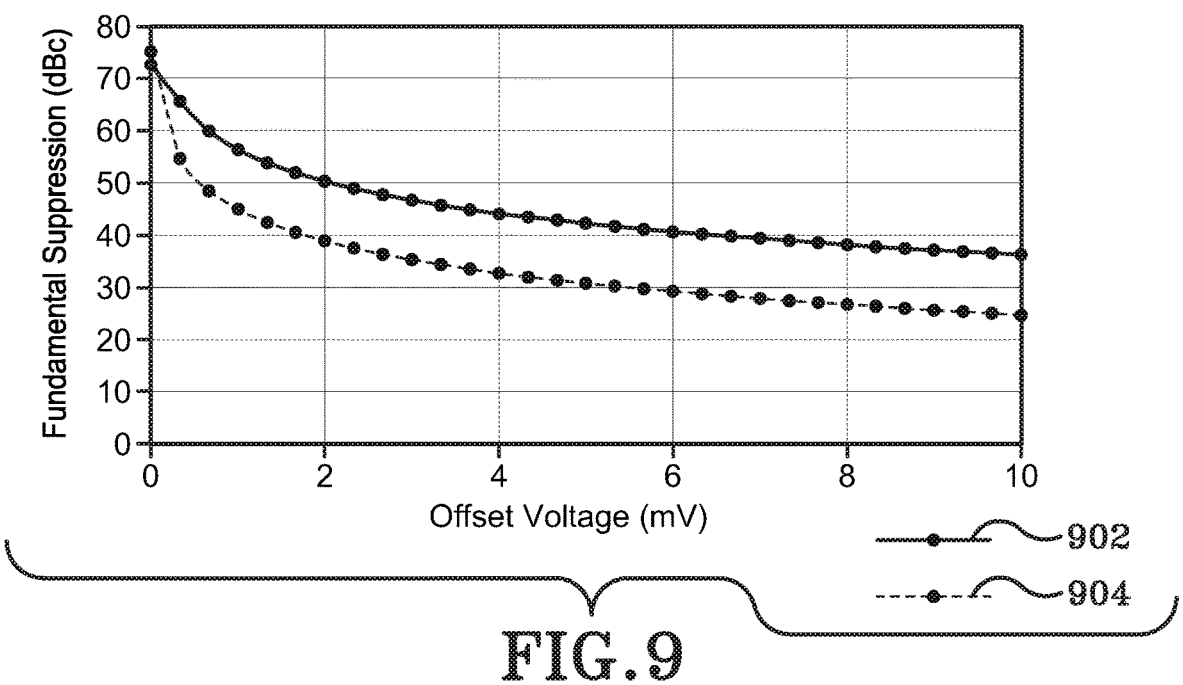
FIG. 9 is a graph of fundamental suppression in decibels relative to the second harmonic carrier (dBc) versus offset voltage in millivolts (mV) for the PRIOR ART Gilbert cell-based active frequency doubler and an active single-commutator-cell frequency doubler of the present disclosure.

FIG. 9 is a graph of fundamental suppression in decibels relative to the second harmonic carrier (dBc) versus offset voltage in millivolts (mV) for the PRIOR ART Gilbert cell-based active frequency doubler 10 and a 22-44 GHz active single-commutator-cell frequency doubler of the present disclosure. Line 902 represents the fundamental suppression of the active single-commutator-cell frequency doubler of the present disclosure in dBc and line 904 represents the fundamental suppression of the PRIOR ART Gilbert cell-based active frequency doubler 10 in dBc. As shown in FIG. 9, the fundamental suppression of the active single-commutator-cell frequency doubler of the present disclosure is greater than the fundamental suppression of the PRIOR ART Gilbert cell-based active frequency doubler 10.

In accordance with one aspect of the disclosure, a method of frequency multiplying is provided herein. The method includes doubling an input signal with a frequency doubler comprising at least one transformer; wherein each of the at least one transformer includes a primary and a secondary; wherein the secondary includes a center tap; at least one commutator cell; wherein each of the at least one commutator cell includes a first input port and a second input port; wherein the primary is connected to the first input port; wherein the secondary is connected to the second input port; at least one current source; and at least one ground; wherein the center tap is connected to the at least one ground via the at least one current source. The frequency doubler further includes a commutator cell bias circuit for biasing the at least one commutator cell.

The first input port of each of the at least one commutator cell may be connected to bipolar junction transistor (BJT) base terminals and the second input port of each of the at least one commutator cell may be connected to BJT emitter terminals. Alternatively, the first input port of each of the at least one commutator cell may be connected to field effect transistor (FET) gate terminals and the second input port of each of the at least one commutator cell may be connected to FET source terminals.

The method may include receiving an input drive impedance and generating an power output; wherein as the power output increases the input drive impedance decreases. The method may include receiving an input signal and outputting a second harmonic signal.

The method may include driving an RF mixer apparatus with the frequency doubler of the present disclosure. In this example, the method may include receiving an input signal at a differential input port of the frequency doubler and outputting a third harmonic signal from a differential output port of the RF device. The method may include splitting a fundamental signal between the frequency doubler and the RF mixer apparatus.

Alternatively, the frequency doubler may be a first frequency doubler and the method may include driving a second frequency doubler. In this example, the method may include receiving an input signal at a differential input port of the first frequency doubler and outputting a fourth harmonic signal from a differential output port of the second frequency doubler.

The at least one transformer may include a plurality of transformers; wherein each primary of the plurality of transformers is connected in series; wherein the at least one commutator cell includes a plurality of commutator cells; wherein each secondary is connected across one of the plurality of commutator cells; wherein the at least one current source includes a plurality of current sources; wherein the plurality of current sources provides a total commutator cell current to the plurality of commutator cells. The method may include splitting the total commutator cell current substantially equally between the plurality of commutator cells.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A frequency doubler comprising:
   at least one transformer including a primary and a secondary; wherein the secondary includes a center tap;
   at least one commutator cell including a first input port and a second input port; wherein the primary is connected to the first input port; wherein the secondary is connected to the second input port;
   at least one current source; and
   and at least one ground; wherein the center tap is connected to the at least one ground via the at least one current source.

2. The frequency doubler of claim 1, wherein the first input port of each of the at least one commutator cell is connected to bipolar junction transistor (BJT) base terminals; and wherein the second input port of each of the at least one commutator cell is connected to BJT emitter terminals.

3. The frequency doubler of claim 1, wherein the first input port of each of the at least one commutator cell is connected to field effect transistor (FET) gate terminals; and wherein the second input port of each of the at least one commutator cell is connected to FET source terminals.

4. The frequency doubler of claim 1, further comprising:
   a commutator cell bias circuit for biasing the at least one commutator cell.

5. The frequency doubler of claim 1, further comprising:
   a differential input port; wherein the differential input port receives a input signal; and
   a differential output port; wherein the differential output port outputs a second harmonic signal.

6. The frequency doubler of claim 1, wherein the at least one transformer includes a plurality of transformers; wherein each primary of the plurality of transformers is connected in series; wherein the at least one commutator cell includes a plurality of commutator cells; wherein each secondary is connected across one of the plurality of commutator cells; wherein the at least one current source includes a plurality of current sources; wherein the plurality of current sources provides a total commutator cell current to the plurality of commutator cells; and wherein the total commutator cell current is split substantially equally between the plurality of commutator cells.

7. The frequency doubler of claim 6, further comprising:
   a differential input port; wherein the plurality of commutator cells presents a total commutator cell impedance; and wherein the total commutator cell impedance is substantially matched to an RF source.

8. The frequency doubler of claim 7, wherein the plurality of transformers modifies the total commutator cell impedance.

9. A system comprising:
   a frequency doubler including at least one transformer; wherein each of the at least one transformer includes a primary and a secondary; wherein the secondary includes a center tap; at least one commutator cell; wherein each of the at least one commutator cell includes a first input port and a second input port; wherein the primary is connected to the first input port; wherein the secondary is connected to the second input port; at least one current source; and at least one ground; wherein the center tap is connected to the at least one ground via the at least one current source; and
   a radio frequency (RF) device; wherein the frequency doubler drives the RF device.

10. The system of claim 9, wherein the first input port of each of the at least one commutator cell is connected to bipolar junction transistor (BJT) base terminals; and wherein the second input port of each of the at least one commutator cell is connected to BJT emitter terminals.

11. The system of claim 9, wherein the first input port of each of the at least one commutator cell is connected to field effect transistor (FET) gate terminals; and wherein the second input port of each of the at least one commutator cell is connected to FET source terminals.

12. The system of claim 9, further comprising:
   a commutator cell bias circuit of the frequency doubler for biasing the at least one commutator cell.

13. The system of claim 9, wherein the RF device is an RF mixer apparatus.

14. The system of claim 13, further comprising:
   a differential input port of the frequency doubler; wherein the differential input port receives a input signal; and
   a differential output port of the RF mixer apparatus; wherein the differential output port outputs a third harmonic signal.

15. The frequency doubler of claim 13, further comprising:
   a differential input port of the frequency doubler; and
   a differential input port of the RF mixer apparatus; wherein a fundamental signal is split between the frequency doubler and the RF mixer apparatus.

16. The system of claim 9, wherein the frequency doubler is a first frequency doubler and the RF device is a second frequency doubler.

17. The frequency doubler of claim 16, further comprising:
   a differential input port of the first frequency doubler; wherein the differential input port receives a input signal; and
   a differential output port of the second frequency doubler; wherein the differential output port outputs a fourth harmonic signal.

18. The system of claim 9, wherein the RF device is a cascaded multiplier.

19. The system of claim 9, wherein the at least one transformer includes a plurality of transformers; wherein each primary of the plurality of transformers is connected in series; wherein the at least one commutator cell includes a plurality of commutator cells; wherein each secondary is connected across one of the plurality of commutator cells; wherein the at least one current source includes a plurality of current sources; wherein the plurality of current sources provides a total commutator cell current to the plurality of commutator cells; and wherein the total commutator cell current is split substantially equally between the plurality of commutator cells.

20. The system of claim 19, further comprising:
   a differential input port of the frequency doubler; wherein the plurality of commutator cells presents a total commutator cell impedance; and wherein the total commutator cell impedance is substantially matched to an RF source.

* * * * *